(12) United States Patent
Briere

(10) Patent No.: US 9,281,388 B2
(45) Date of Patent: Mar. 8, 2016

(54) COMPOSITE SEMICONDUCTOR DEVICE WITH A SOI SUBSTRATE HAVING AN INTEGRATED DIODE

(75) Inventor: Michael A. Briere, Scottsdale, AZ (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 13/544,829

(22) Filed: Jul. 9, 2012

(65) Prior Publication Data
US 2013/0015499 A1    Jan. 17, 2013

Related U.S. Application Data

(60) Provisional application No. 61/508,292, filed on Jul. 15, 2011.

(51) Int. Cl.
  H01L 29/66 (2006.01)
  H01L 29/778 (2006.01)
  H01L 29/417 (2006.01)
  H01L 27/06 (2006.01)
  H01L 29/20 (2006.01)

(52) U.S. Cl.
  CPC ........ *H01L 29/7787* (2013.01); *H01L 27/0694* (2013.01); *H01L 29/41766* (2013.01); *H01L 29/2003* (2013.01); *H01L 2224/48091* (2013.01); *H01L 2924/12032* (2013.01); *H01L 2924/13091* (2013.01)

(58) Field of Classification Search
None
See application file for complete search history.

(56) References Cited

U.S. PATENT DOCUMENTS

| 6,617,060 | B2 | 9/2003 | Weeks |
| 6,649,287 | B2 | 11/2003 | Weeks |
| 7,112,830 | B2 | 9/2006 | Munns |
| 7,339,205 | B2 | 3/2008 | Piner |
| 7,382,001 | B2 | 6/2008 | Beach |
| 7,456,442 | B2 | 11/2008 | Munns |
| 7,745,849 | B2 | 6/2010 | Briere |
| 7,759,699 | B2 | 7/2010 | Beach |
| 7,884,395 | B2 | 2/2011 | Saito |
| 7,892,938 | B2 | 2/2011 | Beach |
| 7,915,645 | B2 | 3/2011 | Briere |
| 7,935,983 | B2 | 5/2011 | Saito et al. |

(Continued)

FOREIGN PATENT DOCUMENTS

| JP | H 8-274311 | 10/1996 |
| JP | H 08274311 | 10/1996 |

(Continued)

OTHER PUBLICATIONS

U.S. Appl. No. 61/449,046, filed Mar. 3, 2011, Briere.

(Continued)

*Primary Examiner* — Evan Pert
*Assistant Examiner* — Shaka White
(74) *Attorney, Agent, or Firm* — Farjami & Farjami LLP

(57) ABSTRACT

There are disclosed herein various implementations of composite semiconductor devices. In one implementation, such a composite semiconductor device includes a semiconductor on insulator (SOI) substrate including a diode and an insulator layer. The composite semiconductor device also includes a transition body formed over the diode, and a transistor formed over the transition body. The diode is connected across the transistor using through-semiconductor vias, external electrical connectors, or a combination of the two.

29 Claims, 6 Drawing Sheets

(56) References Cited

U.S. PATENT DOCUMENTS

| | | |
|---|---|---|
| 8,084,785 B2 | 12/2011 | Briere |
| 8,183,595 B2 | 5/2012 | Briere |
| 8,350,296 B2 | 1/2013 | Bramian |
| 8,482,035 B2 | 7/2013 | Briere |
| 8,575,660 B2 | 11/2013 | Nelson |
| 2004/0026728 A1 | 2/2004 | Yoshida |
| 2006/0231836 A1 | 10/2006 | Kumagai |
| 2007/0056506 A1 | 3/2007 | Bridger |
| 2008/0315257 A1* | 12/2008 | Shiraishi ........................ 257/195 |
| 2009/0008647 A1* | 1/2009 | Li et al. ........................... 257/76 |
| 2009/0050939 A1 | 2/2009 | Briere |
| 2009/0166677 A1* | 7/2009 | Shibata et al. ................ 257/192 |
| 2009/0189191 A1 | 7/2009 | Sato |
| 2011/0210337 A1 | 9/2011 | Briere |
| 2011/0210338 A1 | 9/2011 | Briere |
| 2012/0145995 A1 | 6/2012 | Jeon |
| 2012/0153300 A1* | 6/2012 | Lidow et al. .................... 257/77 |
| 2012/0153351 A1 | 6/2012 | Chandolu |

FOREIGN PATENT DOCUMENTS

| | | |
|---|---|---|
| JP | 2009-54757 | 3/2009 |
| JP | 2009-64883 | 3/2009 |
| WO | WO 90/07192 | 6/1990 |

OTHER PUBLICATIONS

U.S. Appl. No. 61/508,292, filed Jul. 15, 2011, Briere.

* cited by examiner

COMPOSITE SEMICONDUCTOR DEVICE WITH A SOI SUBSTRATE HAVING AN INTEGRATED DIODE

The present application claims the benefit of and priority to a provisional application entitled "III-Nitride Device Integration with Group IV P—N Antiparallel Diode," Ser. No. 61/508,292 filed on Jul. 15, 2011. The disclosure in this provisional application is hereby incorporated fully by reference into the present application.

BACKGROUND

I. Definitions

As used herein, the phrase "group III-V" refers to a compound semiconductor that includes a group V element and at least one group III element. Moreover, the phrase "III-Nitride" or "III-N" refers to a compound semiconductor that includes nitrogen (N) and at least one group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aP_bN_{(1-a-b)}$), for example. III-Nitride also refers generally to any polarity including but not limited to Ga-polar, N-polar, semi-polar or non-polar crystal orientations. A III-Nitride material may also include either the Wurtzitic, Zincblende, or mixed polytypes, and may include single-crystal, monocrystalline, polycrystalline, or amorphous structures.

Also as used herein, the phrase "group IV" refers to a semiconductor that includes at least one group IV element, including silicon (Si), germanium (Ge), and carbon (C), and also includes compound semiconductors such as SiGe and SiC, for example. Group IV may also refer to a semiconductor material which consists of layers of group IV elements or doping of group IV elements to produce strained silicon or other strained group IV material. In addition, group IV based composite substrates may include semiconductor on insulstor (SOI), separation by implantation of oxygen (SIMOX) process substrates, and silicon on sapphire (SOS), for example. Moreover, a group IV device may include devices formed using standard CMOS processing, but may also include NMOS and PMOS device processing.

The group III-V device can include any suitable semiconductor material that forms a field-effect transistor (FET) such as an insulated-gate FET (IGFET), or a high electron mobility transistor (HEMT), for example. Suitable semiconductor materials include group IV semiconductor materials such as Si, strained silicon, SiGe, SiC, and group III-V materials including III-As, III-Nitride or any of their alloys.

II. Background Art

Group III-V transistors, such as III-Nitride field-effect transistors (III-Nitride FETs) and III-Nitride high mobility electron transistors (III-Nitride HEMTs), are often utilized in high power switching applications due to their performance advantages. For example, III-Nitride FETs and III-Nitride HEMTs have a well deserved reputation for low on-state resistance with the ability to sustain high operating voltages.

However, and perhaps because of their tolerance for high voltage operation, high voltage (HV) group III-V transistors are sometimes implemented in extreme operating environments in which very high voltages can be produced. As a result, even nominally HV rated III-Nitride FETs and HV rated III-Nitride HEMTs may be susceptible to catastrophic failure in practice.

SUMMARY

The present disclosure is directed to a composite semiconductor device with a SOI substrate having an integrated diode, substantially as shown in and/or described in connection with at least one of the figures, and as set forth more completely in the claims.

DETAILED DESCRIPTION

Figure 1:
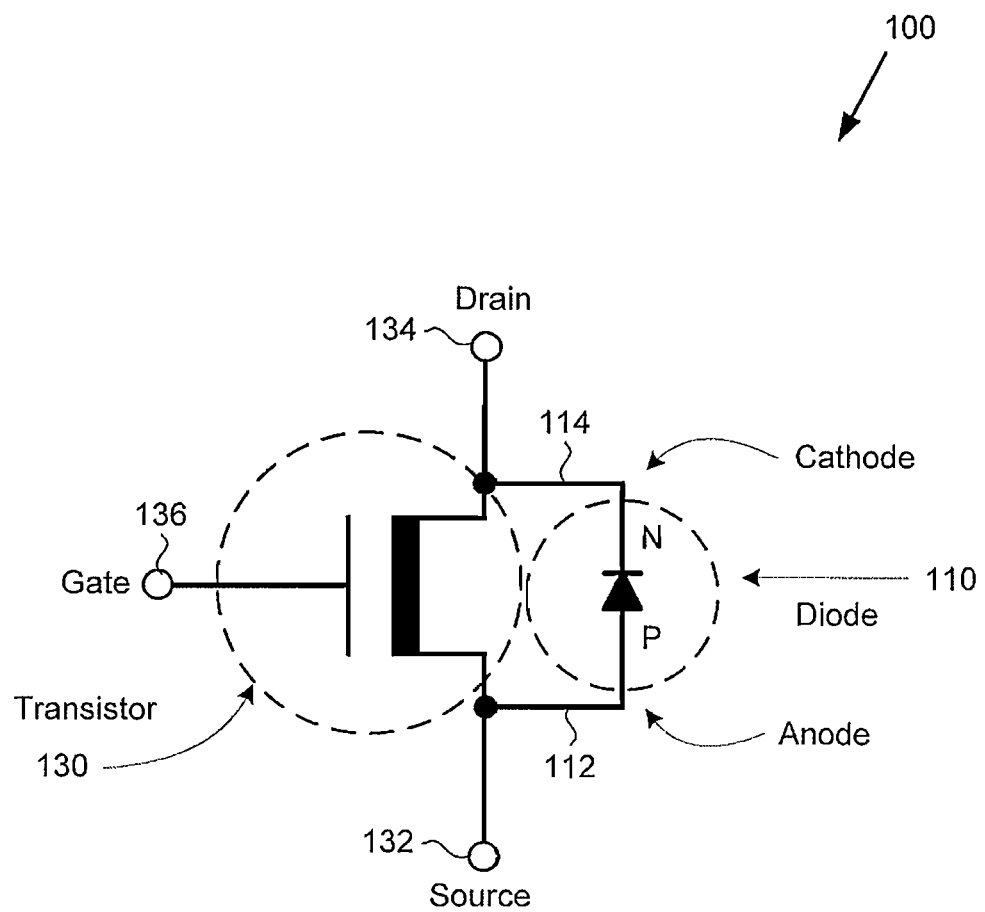
FIG. 1 presents a schematic diagram showing one exemplary implementation of a composite semiconductor device including a transistor and a diode.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Group III-V semiconductors include III-Nitride materials formed of gallium nitride (GaN) and/or its alloys, such as aluminum gallium nitride (AlGaN), indium gallium nitride (InGaN), and aluminum indium gallium nitride (AlInGaN). These materials are semiconductor compounds that have a relatively wide, direct bandgap and strong piezoelectric polarizations, and can enable high breakdown fields and the creation of two-dimensional electron gases (2DEGs). As a result, III-Nitride materials such as GaN are used in many microelectronic applications in which high power density and high efficiency switching are required.

As noted above, however, perhaps because of their known tolerance for high voltage operation, high voltage (HV) group III-V transistors such as III-Nitride transistors are sometimes implemented in extreme operating environments in which very high voltages can be produced. As a result, even nominally HV rated III-Nitride transistors may be susceptible to catastrophic failure. To prevent such catastrophic failure in implementations of the present inventive concepts, a diode is placed across the source and drain of the group III-V transistor. This diode may be designed to have a breakdown voltage which is greater then the required operating voltage of the composite device and less than a voltage causing catastrophic failure of the group III-V transistor.

In one implementation, the diode may be monolithically integrated with the transistor and semiconductor substrate. However, given that group III-V based transistors can be operated at high voltages, certain configurations of integration may be less advantageous than others. For example, HV high electron mobility transistors (HEMTs) typically work best when the substrate is tied to the source, and typically do not work as well when the substrate is tied to the drain. This has consequences for the configuration of the diode when integrated and formed within the substrate.

One way to overcome such problems is through the use of a semiconductor on insulator (SOI) substrate, wherein the integrated diode is formed within the SOI substrate. The SOI substrate can offer the added benefit of providing a RESURF effect for a group III-V HEMT when the diode is formed below the insulator layer of the SOI substrate. The following disclosure describes a composite semiconductor device with a SOI substrate having an integrated diode.

FIG. 1 presents a schematic diagram showing one exemplary implementation of a composite semiconductor device including a transistor and a diode. As shown in FIG. 1, composite semiconductor device 100 includes transistor 130 and diode 110 coupled across transistor 130. Transistor 130 includes source contact 132, drain contact 134, and gate contact 136, while diode 110 includes anode 112 and cathode 114. As further shown in FIG. 1, diode 110 may be coupled across transistor 130 in an antiparallel configuration. That is to say, anode 112 of diode 110 may be coupled to source contact 132 of transistor 130, and cathode 114 of diode 110 may be coupled to drain contact 134 of transistor 130.

Transistor 130, which may be an NV transistor, may be formed as a group III-V power transistor. In some implementations, for example, transistor 130 may be formed of a III-Nitride material such as GaN, and may be implemented as an insulated-gate field-effect transistor (IGFET) or as a heterostructure FET (HFET). In one implementation, transistor 130 may take the form of a metal-insulator-semiconductor FET (MISFET), such as a metal-oxide-semiconductor FET (MOSFET). Alternatively, when implemented as an HFET, transistor 130 may be a HEMT configured to produce a 2DEG. According to one implementation, for example, transistor 130 may be configured to sustain a drain voltage of greater than approximately 600V with a gate rating of greater than approximately 20V.

According to the implementation shown by FIG. 1, diode 110 is a PN junction diode. Diode 110 may be implemented as an HV group IV PN diode, such as an HV silicon PN diode, for example. Moreover, in other implementations, diode 110 may be implemented as a PIN diode.

In one implementation, composite semiconductor device 100 includes transistor 130 monolithically integrated with diode 110, using a vertical integration scheme. Diode 110 may be integrated with transistor 130 in such a way as to provide for nondestructive avalanche breakdown capability of composite semiconductor device 100, thereby protecting transistor 130 from failing catastrophically. In some implementations, an HV PN diode serving as diode 110 is designed to have a breakdown voltage less than a breakdown voltage of transistor 130. For example, transistor 130 may have a breakdown voltage of 700V, while diode 110 may be designed to have an avalanche breakdown voltage of 650V. Diode 110 may be designed to have a lower or higher avalanche breakdown voltage based on the desired breakdown voltage of composite semiconductor device 100. As a result, the antiparallel configuration of diode 110 and transistor 130 represented in FIG. 1 can provide robust, failure resistant, composite semiconductor device 100.

As noted, in some implementations, composite semiconductor device 100 including transistor 130 and diode 110 may be monolithically integrated. Various integration schemes for monolithically integrating III-Nitride and group IV semiconductor devices are disclosed in U.S. Pat. No. 7,915,645 issued on Mar. 29, 2011, and titled "Monolithic Vertically Integrated Composite Group III-V and Group IV Semiconductor Device and Method for Fabricating Same;" in U.S. patent application Ser. No. 12/174,329 filed on Jul. 16, 2008, and titled "III-Nitride Device;" in U.S. patent application Ser. No. 12/928,103 filed on Dec. 3, 2010, and titled "Monolithic Integration of Silicon and Group III-V Devices;" and in U.S. patent application Ser. No. 13/020,243 filed on Feb. 3, 2011, and titled "Efficient High Voltage Switching Circuits and Monolithic Integration of Same" the entire disclosures of which are hereby incorporated fully by reference into the present application.

Figure 2:
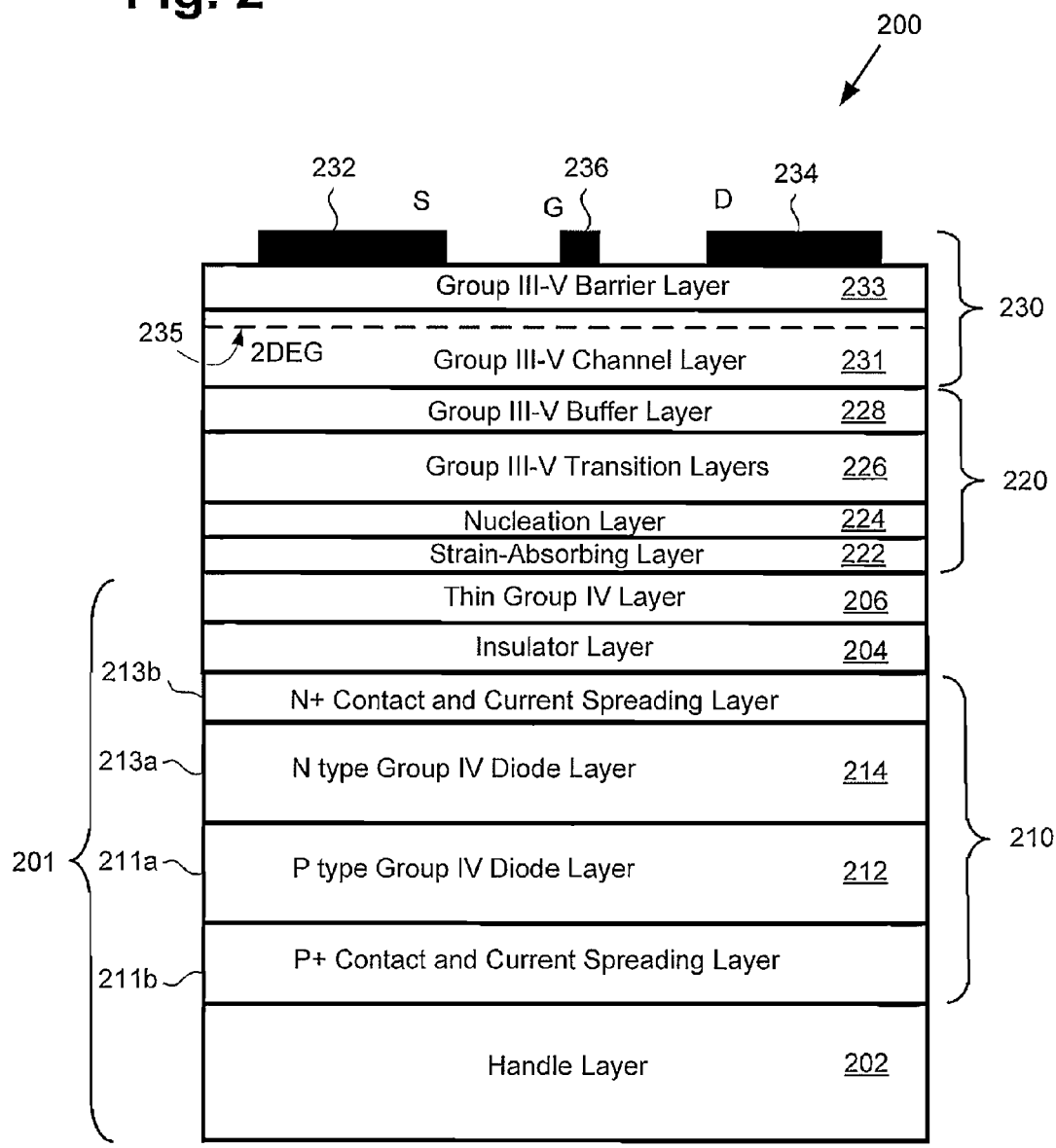
FIG. 2 presents a cross-sectional view of an exemplary structure implementing a composite semiconductor device including a transistor formed over a semiconductor on insulator (SOI) substrate including an integrated diode, corresponding in general to the schematic diagram of FIG. 1.

FIG. 2 presents a cross-sectional view of an exemplary structure implementing a composite semiconductor device including a transistor formed over a SOI substrate including an integrated diode, corresponding in general to the schematic diagram of FIG. 1. Composite semiconductor device 200 includes SOI substrate 201 having diode 210 including anode 212 and cathode 214 formed therein, insulator layer 204 disposed over diode 210, and thin group IV layer 206 situated over insulator layer 204. Composite semiconductor device 200 also includes transition body 220 formed over diode 210 and insulator layer 204, and transistor 230 including source electrode 232, drain electrode 234, and gate electrode 236 formed over transition body 220. Transistor 230 including source electrode 232, drain electrode 234, and gate electrode 236, and diode 210 including anode 212 and cathode 214 correspond respectively to transistor 130 including source contact 132, drain contact 132, and gate contact 136, and diode 110 including anode 112 and cathode 114, in FIG. 1. Also shown in FIG. 2 are handle layer 202 of SOI substrate 201, P type diode layer 211a providing anode 212, N type diode layer 213a providing cathode 214, P+ layer 211b, and N+ layer 213b.

Diode 210 includes P type diode layer 211a providing anode 212 and N type diode layer 213a providing cathode 214, as well as P+ layer 211b and N+ layer 213b providing contact and current spreading layers for anode 212 and cathode 214, respectively. According to the implementation of FIG. 2, P type diode layer 211a, which may be a P type silicon or other group IV semiconductor layer, is formed as a bottom layer of diode 210. N type diode layer 213a, which may be an N type silicon or other group IV semiconductor layer, is formed as a top layer of diode 210 and is disposed over P type diode layer 211a. The interface of P type diode layer 211a with N type diode layer 213a forms a PN junction in diode 210. As a result, in the implementation of FIG. 2, diode 210 is a PN junction diode. It is noted that P type diode layer 211a and N type diode layer 213a may be formed as epitaxial or non-epitaxial group IV semiconductor layers.

It is further noted that, although diode 210 is depicted as having N type diode layer 213a disposed over P type diode layer 211a, that representation is merely exemplary. In another implementation, P type diode layer 211a providing anode 212 may overlie N type diode layer 213a providing cathode 214, which in that implementation forms the bottom layer of diode 210. In still other implementations, for example, diode 210 may include an N type or P type diode layer having a respective P type or N type well formed therein. In such implementations, the interface of the well boundary with the opposite conductivity diode layer in which the well is formed may provide the PN junction of diode 210. In yet another implementation, diode 210 may be a PIN diode. As such, there may be an interlying intrinsic, near intrinsic or otherwise unintentionally doped layer or layers (not shown in FIG. 2) disposed over P type diode layer 211a and under N type diode layer 213a, for example.

According to another implementation, diode 210 may be lifetime engineered to reduce the recovery time for stored charge. For example, the PN junction diode 210 can be engineered by modifying the crystal structure using various common techniques known in the art including electron irradiation, ion implantation and platinum doping, amongst others.

As shown in FIG. 2, diode 210 may be formed in SOI substrate 201 including handle layer 202 and thin group IV layer 206 in addition to diode 210 and insulator layer 204. As further shown in FIG. 2, diode 210 may be formed between handle layer 202 and insulator layer 204, while thin group IV layer 206 may overlie insulator layer 204. Handle layer 202 may be a bulk silicon layer, for example, having diode 210 including P type diode layer 211 and N type diode layer formed thereon, while insulator layer 204 may be formed over diode 210 using any suitable dielectric material, such as silicon dioxide (SiO$_2$) for example. Thin group IV layer 206 may be used as an additional group IV device layer, or thin group IV layer 206 may serve as a foundation layer for the group III-V device stack including transition body 220 and transistor 230.

Figure 3:
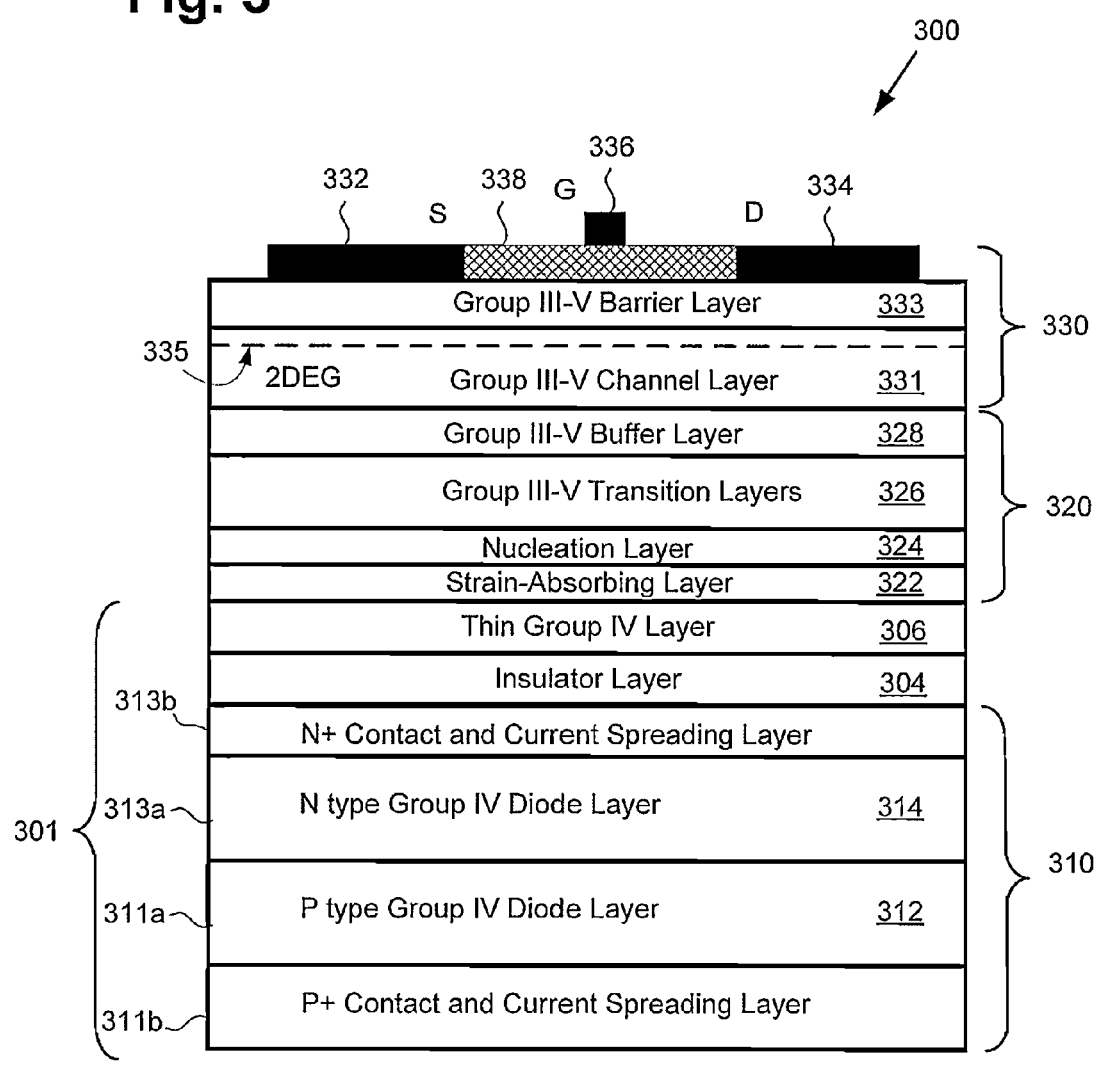
FIG. 3 presents a cross-sectional view of another exemplary structure implementing a composite semiconductor device including a transistor formed over a SOI substrate including an integrated diode, corresponding in general to the schematic diagram of FIG. 1.

It is reiterated that the structure shown in FIG. 2 is merely exemplary, and that numerous variations may be implemented without departing from the present inventive concepts. For example, in one implementation, SOI substrate 201 may omit handle layer 202, as is shown in FIG. 3. As another example, in some implementations, one or more intermediate layers may be situated between N+ layer 213b and insulator layer 204. Such an intermediate layer or layers may comprise a lightly N type doped, or a P type doped semiconductor layer, for example.

In some implementations, SOI substrate 201 may be a separation by implantation of oxygen (SIMOX) processed substrate in which insulator layer 204 is a buried oxide. In yet other implementations, insulator layer 204 may be formed of other dielectric or insulating material including wide bandgap materials (e.g., MN and AlGaN) as described in U.S. Pat. No. 7,892,938 issued on Feb. 22, 2011, and titled "Structure and Method for III-Nitride Monolithic Power IC," the entire disclosure of which is hereby incorporated fully by reference into the present application.

It is further noted that in certain other implementations, P type diode layer 211a and P+ layer 211b may be formed and terminated through lithographically defined regions, for example implantation, diffusion and/or the use of conductive thin films (e.g., doped polysilicon) on the backside of a double sided finished group IV substrate as disclosed in U.S. Pat. No. 7,915,645 issued on Mar. 29, 2011, and titled "Monolithic Vertically Integrated Composite Group III-V and Group IV Semiconductor Device and Method for Fabricating Same," the entire disclosure of which is hereby incorporated fully by reference into the present application.

According to the exemplary implementation of FIG. 2, transistor 230 is depicted as a group III-V HEMT. Thus, transistor 230 includes channel layer 231 and barrier layer 233 producing 2DEG 235 near their heterojunction interface. Moreover, as shown in FIG. 2, transition body 220 underlying transistor 230 is shown to include strain-absorbing layer 222, nucleation layer 224, transition layers 226, and buffer layer 228.

As shown in FIG. 2, transition body 220 includes multiple semiconductor layers, e.g., at least group III-V transition layers 226 and group III-V buffer layer 228. According to one implementation, strain-absorbing layer 222 is formed over thin group IV layer 206. Strain-absorbing layer 222 may be an amorphous strain-absorbing layer, such as an amorphous silicon nitride layer. In this regard, the entire disclosure provided by U.S. Pat. No. 7,339,205 issued on Mar. 4, 2008, and titled "Gallium Nitride Materials and Methods Associated with the Same," is hereby incorporated fully by reference into the present application.

According to the implementation shown in FIG. 2, nucleation layer 224 is formed over strain-absorbing layer 222. Nucleation layer 224 may be formed as an aluminum nitride (AlN) layer, and may be grown using any suitable techniques, as known in the art. Although FIG. 2 depicts nucleation layer 224 to be disposed over strain-absorbing layer 222, it is noted that, in some implementations, it may be desirable not to form strain-absorbing layer 222 prior to growing nucleation layer 224. Moreover, in some implementations, nucleation layer 224 includes one or more layers formed using different growth environments. In this latter regard, the entire disclosures provided by U.S. Pat. No. 6,617,060 issued on Sep. 9, 2003, and titled "Gallium Nitride Materials and Methods;" and U.S. patent application Ser. No. 11/531,508 filed on Sep. 13, 2006, and titled "Process for Manufacture of Super Lattice Using Alternating High and Low Temperature Layers to Block Parasitic Current Path;" are hereby incorporated fully by reference into the present application.

Referring to transition layers 226, it is noted that in some implementations, transition body 220 and transistor 230 may be formed of compositionally graded III-Nitride or other group III-V materials. In such implementations, the specific compositions and thicknesses of transition Layers 226 is dependent on the diameter and thickness of the substrate used, and the desired performance of transistor 230. For example, the desired breakdown voltage of transistor 230, as well as the desired wafer bow and warp of composite semiconductor device 200 can influence the compositions and thicknesses of transition layers 226. In this regard, the entire disclosures provided by U.S. Pat. No. 6,649,287 issued on Nov. 18, 2003, and titled "Gallium Nitride Materials and Methods;" U.S. patent application Ser. No. 12/587,964 filed on Oct. 14, 2009, and titled "Group III-V Semiconductor Device with Strain-relieving Interlayers;" U.S. patent application Ser. No. 12/928,946 filed on Dec. 21, 2010, and titled "Stress Modulated Group III-V Semiconductor Device and Related Method;" U.S. Pat. No. 7,112,830 issued on Sep. 26, 2006, and titled "Super Lattice Modification of Overlying Transistor;" U.S. Pat. No. 7,456,442 issued on Nov. 25, 2008, and titled "Super Lattice Modification of Overlying Transistor;" U.S. patent application Ser. No. 11/531,508 filed on Sep. 13, 2006, and titled "Process for Manufacture of Super Lattice Using Alternating High and Low Temperature Layers to Block Parasitic Current Path;" and U.S. Provisional Patent Application No. 61/449,046 filed on Mar. 3, 2011, and titled "III-Nitride Material Interlayer Structures;" are hereby incorporated fully by reference into the present application.

As further shown in FIG. 2, transition body 220 also includes buffer layer 228. According to one implementation, buffer layer 228 is disposed over transition layers 226. Buffer layer 228 may be formed of any suitable group III-V semiconductor material. Where transistor 230 is implemented as a III-Nitride HEMT, for example, buffer layer 228 may be formed as a doped or undoped III-Nitride layer. For instance, in one implementation, buffer layer 228 may be an intrinsic GaN layer, grown using any suitable technique, as known in the art.

Transistor 230 including channel layer 231 and barrier layer 233 is formed over transition body 220. In one implementation, for example, a III-Nitride HEMT may be formed through use of a GaN layer as channel layer 231 and use of an AlGaN layer as barrier layer 233. As shown in FIG. 2, 2DEG 235 is produced by the heterojunction forming the interface of channel layer 231 and barrier layer 233. In certain applications, it may be desirable to form barrier layer 233 over a spacer layer (or layers) which may be disposed between barrier layer 233 and channel layer 231.

Source electrode 232, drain electrode 234, and gate electrode 236 are formed over barrier layer 233. Source electrode 232 and drain electrode 234 are formed such that they make ohmic contact with barrier layer 233 and channel layer 231. In the implementation shown by FIG. 2, gate electrode 236 makes Schottky contact with barrier layer 233 and is formed directly on barrier layer 233, or on a thin (e.g., 1-3 nanometers thick) capping layer of GaN or AlGaN disposed above barrier layer 233. According to the present exemplary implementation, transistor 230 forms a normally ON (depletion mode) HEMT. In some applications, however, it may be desirable to form an insulated gate transistor by forming an insulating layer between gate electrode 336 and barrier layer 333, as discussed below by reference to FIGS. 3 and 4. In some other applications, it may be desirable to form a gate insulated normally OFF (enhancement mode) HEMT as transistor 230. That is to say, in addition to having an insulated gate, it may be desirable in some circumstances to have 2DEG 235 interrupted under gate electrode 236 in the absence of an applied gate voltage.

Several modifications to the design of transistor 230 can result in formation of a normally OFF enhancement mode HEMT. For example, an additional layer of P type III-Nitride or other group III-V material may be disposed under gate electrode 236, or a floating gate design may be utilized. Alternatively, or in addition, the region under gate electrode 236 may be doped so as to deplete 2DEG 235 under gate electrode 236, while other techniques exist as well. In this regard, the entire disclosures provided by U.S. Pat. No. 7,382,001 issued Jun. 3, 2008, and titled "Enhancement Mode III-Nitride FET;" U.S. Pat. No. 7,759,699 issued on Jul. 20, 2010, and titled "III-Nitride Enhancement Mode Devices;" U.S. Pat. No. 8,084,785 issued on Dec. 27, 2011, and titled "III-Nitride Power Semiconductor Device Having a Programmable Gate;" U.S. patent application Ser. No. 11/460,725 filed on Jul. 28, 2006, and titled "Normally Off III-Nitride Semiconductor Device Having a Programmable Gate;" U.S. Pat. No. 7,745,849 issued on Jun. 29, 2010, and titled "Enhancement Mode III-Nitride Semiconductor Device with Reduced Electric Field Between the Gate and the Drain;" U.S. patent application Ser. No. 12/195,801 filed on Aug. 21, 2008, and titled "Enhancement Mode III-Nitride Device with Floating Gate and Process for its Manufacture;" and U.S. patent application Ser. No. 13/017,970 filed on Jan. 31, 2011, and titled "Enhancement Mode III-Nitride Transistors with Single Gate Dielectric Structure;" are hereby incorporated fully by reference into the present application.

It is noted that transistor 230 may include one or more additional layers disposed between barrier layer 233 and source electrode 232, drain electrode 234, and gate electrode 236. These additional layers may include additional III-Nitride or other group III-V semiconductor layers, insulating layers, passivation layers, spacer layers between the channel and barrier layers, field plates, and/or metal layers for additional interconnects.

The voltage handling and breakdown capability of transistor 230 is determined by the various compositions, thicknesses, and spacings of several of the layers discussed above and shown in FIG. 2. These include, among others, the thickness and alloy composition of barrier layer 233, the design and composition of gate electrode 236, and the spacing between gate electrode 236 and a drain corresponding to drain electrode 234 (as well as the spacing between gate electrode 236 and a source corresponding to source electrode 232).

Thus, FIG. 2 shows the general formation of an integrated group III-V transistor with a group IV PN diode. In this configuration, diode 210 is connected in reverse bias. The avalanche breakdown voltage limit of diode 210 may be designed to a specific range and may be determined by the constituent dopants and concentrations of P type diode layer 211a providing anode 212 and N type diode layer 213a providing cathode 214. As noted above, because diode 210 is configured to protect transistor 230, with which diode 210 may be monolithically integrated, the design of diode 210 may be such that the avalanche breakdown voltage limit of diode 210 is lower than the breakdown voltage of transistor 230.

Moving to FIG. 3, FIG. 3 presents a cross-sectional view of another exemplary structure implementing a composite semiconductor device including a transistor formed over a SOI substrate including an integrated diode, corresponding in general to the schematic diagram of FIG. 1. Composite semiconductor device 300 includes SOI substrate 301 having diode 310 including P type diode layer 311a providing anode 312, N type diode layer 313a providing cathode 314, and P+ layer 311b and N+ layer 313b providing contact and current spreading layers for anode 312 and cathode 314, respectively, formed therein. SOI substrate 301 is also shown to include insulator layer 304 disposed over diode 310, and thin group IV layer 306 situated over insulator layer 304.

Composite semiconductor device 300 further includes transition body 320 formed over diode 310 and insulator layer 304, and transistor 330 formed over transition body 320. Transistor 330 includes channel layer 331 and barrier layer 333 producing 2DEG 335 near their heterojunction interface, as well as source electrode 332, drain electrode 334, and gate electrode 336 disposed over gate dielectric 338. Transition body 320 includes strain-absorbing layer 322, nucleation layer 324, transition layers 326, and buffer layer 328. In this implementation, unlike composite semiconductor device 200, shown in FIG. 2, composite semiconductor device 300 has no handle layer disposed under P+ layer 311b as part of SOI substrate 301. However, as was true for composite semiconductor device 200, other implementations of composite semiconductor device 300 may include one or more intermediate layers situated between N+ layer 313b and insulator layer 304, such as a lightly N type doped or a P type doped semiconductor layer, for example.

Transition body 320, diode 310, insulator layer 304, and thin group IV layer 306 correspond respectively to transition body 220, diode 210, insulator layer 204, and thin group IV layer 206, in FIG. 2. Composite semiconductor device 300, in FIG. 3, represents a modification to composite semiconductor device 200, in FIG. 2, through substitution of an insulated gate structure for the previous Schottky gate, and the removal of the handle layer. In the implementation of FIG. 3, gate dielectric 338 is formed over the surface of barrier layer 333, between gate electrode 336 and barrier layer 333. In one implementation, for example, gate dielectric 338 may be formed of stoichiometric silicon nitride. In another implementation, several dielectric layers may be used. In yet other implementations, one or more dielectric materials other than silicon nitride may be utilized to form gate dielectric 338.

Transistor 330 including source electrode 332, drain electrode 334, and gate electrode 336, and diode 310 including anode 312 and cathode 314 correspond respectively to transistor 130 including source contact 132, drain contact 132, and gate contact 136, and diode 110 including anode 112 and cathode 114, in FIG. 1. Thus, FIG. 3 shows the general formation of an integrated group III-V transistor with a group IV PN diode according to an alternative structural arrangement. Nevertheless, as was true of diode 210 in FIG. 2, diode 310, in FIG. 3, is connected in reverse bias, i.e., antiparallel. As a result, the configuration shown by FIG. 3 also utilizes the avalanche breakdown voltage limit of diode 310 as an overvoltage protection mechanism for transistor 330.

It is noted that in order to couple diode 310 across transistor 330 in a reverse bias or antiparallel configuration, anode 312 of diode 310 should be connected to source electrode 332 of transistor 330, and cathode 314 of diode 310 should be connected to drain electrode 334 of transistor 330.

Figure 4:
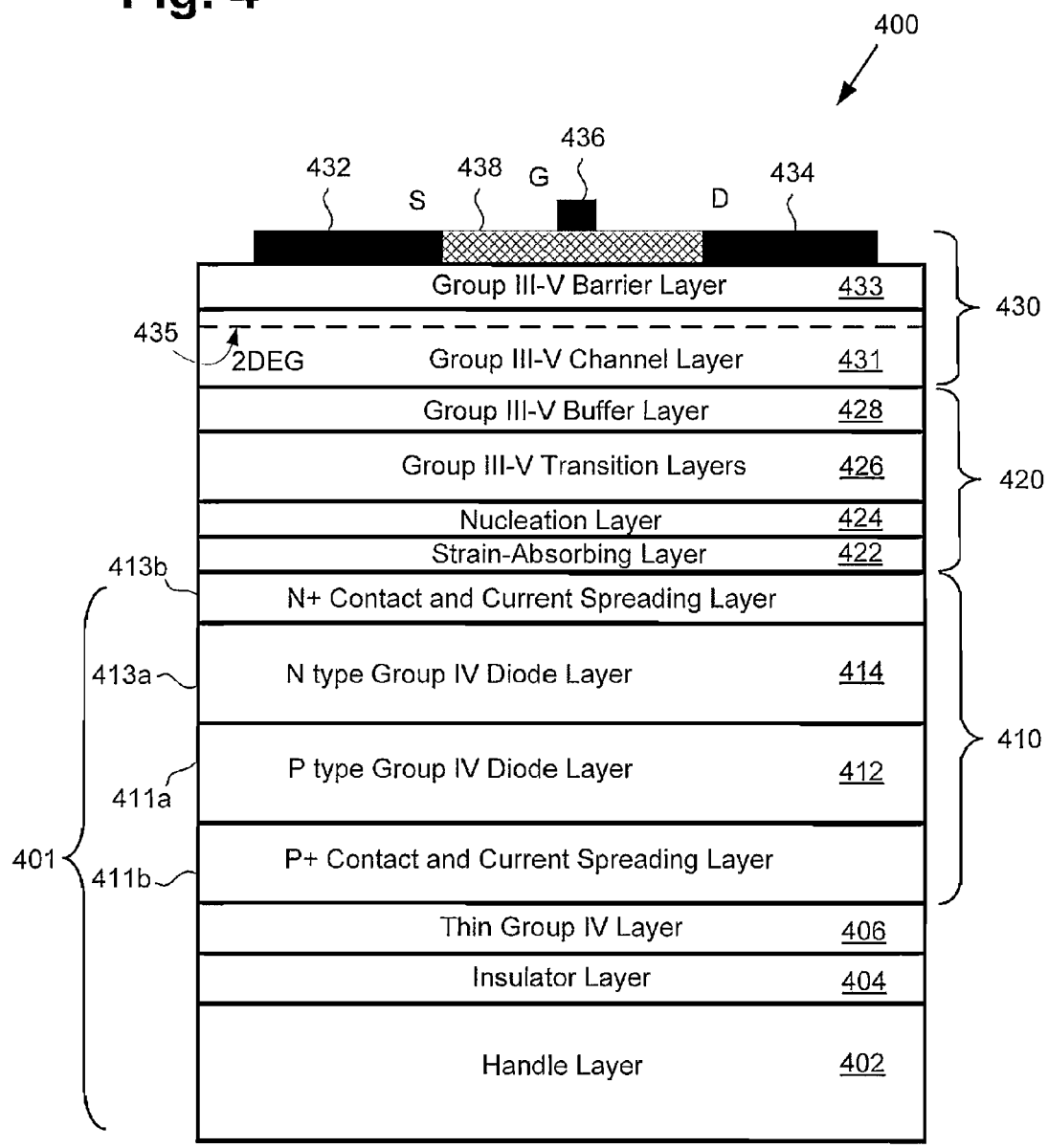
FIG. 4 presents a cross-sectional view of yet another exemplary structure implementing a composite semiconductor device including a transistor formed over a SOI substrate including an integrated diode, corresponding in general to the schematic diagram of FIG. 1.

Referring to FIG. 4, FIG. 4 shows a cross-sectional view of yet another exemplary structure implementing a composite semiconductor device including a transistor formed over a SOI substrate including an integrated diode, corresponding in general to the schematic diagram of FIG. 1. Composite semiconductor device 400 includes SOI substrate 401 having diode 410 including P type diode layer 411a providing anode 412, N type diode layer 413a providing cathode 414, and P+ layer 411b and N+ layer 413b providing contact and current spreading layers for anode 412 and cathode 414, respectively. In addition, SOI substrate 401 includes thin group IV layer 406 disposed under diode 410, handle layer 401, and insulator layer 404 situated between handle layer 402 and thin group IV layer 406.

Composite semiconductor device 400 also includes transition body 420 formed over diode 410, and transistor 430 formed over transition body 420. Transistor 430 includes channel layer 431 and barrier layer 433 producing 2DEG 435 near their heterojunction interface, as well as source electrode 432, drain electrode 434, and gate electrode 436 disposed over gate dielectric 438. Transition body 420 includes strain-absorbing layer 422, nucleation layer 424, transition layers 426, and buffer layer 428.

Transition body 420 and transistor 430 correspond respectively to transition body 320 and transistor 330, in FIG. 3. SOI substrate 401, in FIG. 4, represents a modification to SOI substrate 301, in FIG. 3, through inclusion of handle layer 402, and formation of insulator layer 404 and thin group IV layer 406 between handle layer 402 and diode 410. In other words, unlike SOT substrate 301, in FIG. 3 (and SOI substrate 201, in FIG. 2) in which diode 310/210 is formed under insulator layer 204/304, according to the implementation shown in FIG. 4, diode 410 is formed over insulator layer 404, as well as over thin group IV layer 406.

In yet other implementations, P type diode layer 411a providing anode 412 may be disposed over N type diode layer 413a providing cathode 414, P+ layer 411b may be disposed over P type diode layer 411a, and N+ layer 413b may be disposed under N type diode layer 413a. In this implementation, transition body 420 would be disposed over P+ layer 411b, and thin group IV layer 406 and insulator layer 404 may be disposed between N+ layer 413b and handle layer 402.

Figure 5:
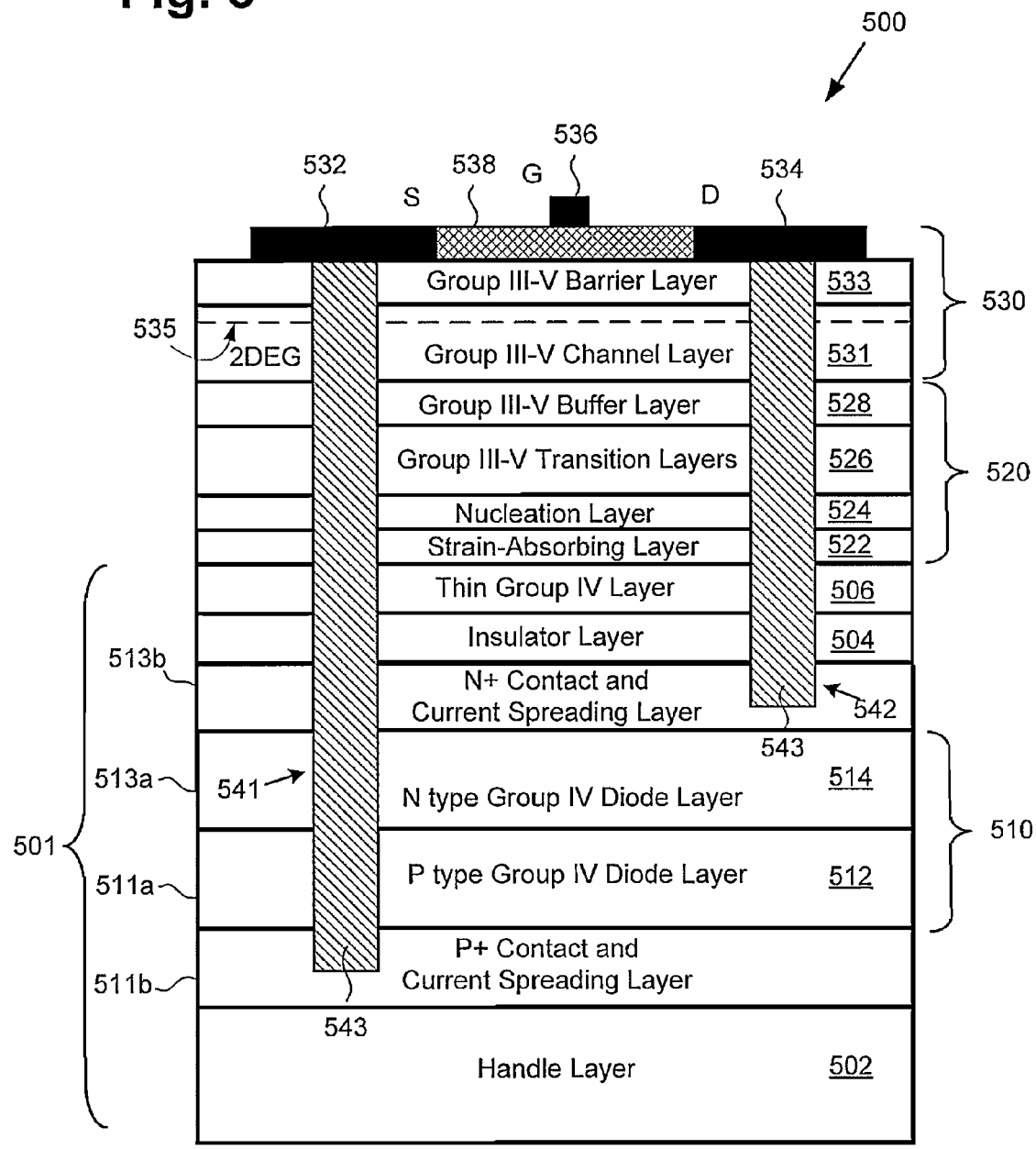
FIG. 5 presents a cross-sectional view of one exemplary implementation of a composite semiconductor device including a transistor formed over a SOT substrate including an integrated diode connected by through-semiconductor vias.
Figure 6:
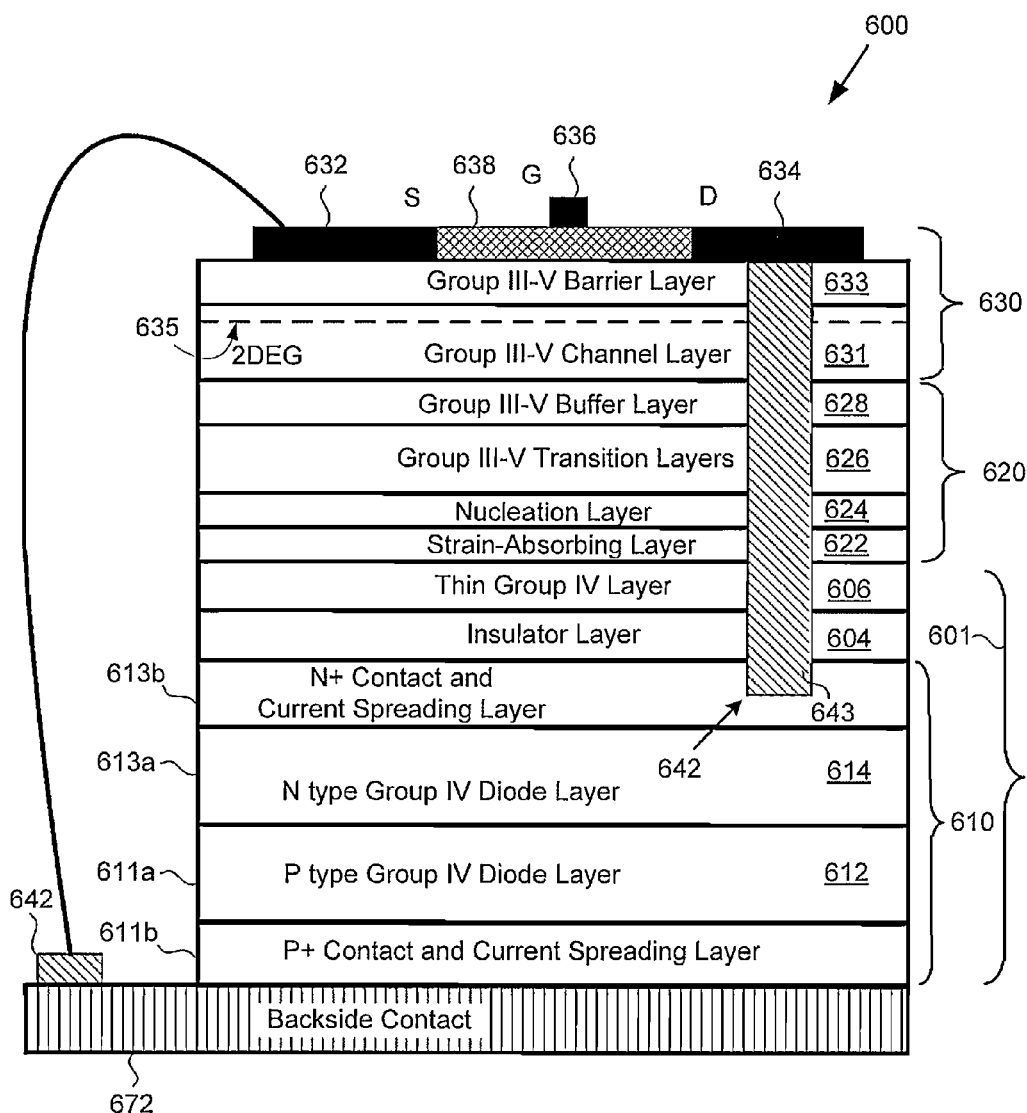
FIG. 6 presents a cross-sectional view of one exemplary implementation of a composite semiconductor device including a transistor formed over a SOI substrate including an integrated diode coupled to the transistor using both an external electrical connector and a through-semiconductor via.

FIGS. 5 and 6 show exemplary solutions for forming electrical connections between an integrated group transistor and an antiparallel diode using one or both of through-semiconductor vias and external electrical connectors. It is noted that although FIGS. 5 and 6 expressly teach the use of through-semiconductor vias and external connectors in conjunction with composite semiconductor device structures corresponding in general to the structure shown in FIG. 3, one of ordinary skill in the art will recognize that the solution disclosed by FIGS. 5 and 6 can be utilized with the composite semiconductor device structures shown by FIGS. 2 and 4 as well.

Referring to FIG. 5, composite semiconductor device 500 includes SOI substrate 501 having diode 510 including anode 512 and cathode 514 formed therein, insulator layer 504 disposed over diode 510, and thin group IV layer 506 situated over insulator layer 504. Composite semiconductor device 500 also includes transition body 520 formed over diode 510 and insulator layer 504, and transistor 530 formed over transition body 520.

Transistor 530 includes channel layer 531 and barrier layer 533 producing 2DEG 535 near their heterojunction interface, as well as source electrode 532, drain electrode 534, and gate electrode 536 disposed over gate dielectric 538. Transition body 520 includes strain-absorbing layer 522, nucleation layer 524, transition layers 526, and buffer layer 528.

Diode 510 includes P type diode layer 511a providing anode 512, and N type diode layer 513a providing cathode 514 and disposed over P type diode layer 511a, and P+ type layer 511b and N+ type layer 513b providing contact and current spreading layers for anode 512 and cathode 514, respectively. Also shown in FIG. 5 are first through-semiconductor via 541 including conductive fill 543, second through-semiconductor via 542 including conductive fill 543, and thin group IV layer 504 and handle layer 502 of SOI substrate 501.

Transition body 520 and SOI substrate 501, including diode 510, correspond in general to respective transition body 220/320 and SOI substrate 201/301 including diode 210/310, in respective FIGS. 2 and 3, and may share any of the characteristics attributed to those corresponding features, above. In addition, transistor 530, in FIG. 5, corresponds to transistor 330, in FIG. 3.

As shown in FIG. 5, first and second through-semiconductor vias 541 and 542 extend through transition body 520, thin group IV layer 506, and insulator layer 504 to couple diode 510 across transistor 530 in an antiparallel configuration. That is to say, first through-semiconductor via 541 connects anode 512 of diode 510 to source electrode 532 of transistor 530, and second through-semiconductor via 542 connects cathode 514 of diode 510 to drain electrode 534 of transistor 530.

As further shown in FIG. 5, according to one implementation, first through-semiconductor via 541 extends from source electrode 532 down through barrier layer 533 and channel layer 531 of transistor 530 to terminate in P+ layer 511b. En route, first through-semiconductor via 541 also extends through the multiple group III-V material layers of transition body 520, i.e., buffer layer 528, transition layers 526, and nucleation layer 524, as well as through strain-absorbing layer 522 of transition body 520, thin group IV layer 506, insulator layer 504, N+ layer 513b, and N type diode layer 513a.

First through-semiconductor via 541 includes conductive fill 543, such as an electrically conductive metal or polysilicon fill, for example, which forms an anode electrode electrically coupling anode 512 through P+ layer 511b to source electrode 532. Examples of materials suitable for use as conductive fill 543 include copper (Cu), tungsten (W), doped polysilicon, or any of a variety of conductive metal alloys. In some implementations, it may be desirable to utilize a different conductive material to form conductive fill 543 than that used to implement source electrode 532.

According to the implementation shown in FIG. 5, second through-semiconductor via 542 extends from drain electrode 534 down through barrier layer 533 and channel layer 531 of transistor 530 to terminate in N+ layer 513b. Second through-semiconductor via 542 extends through the multiple group III-V material layers of transition body 520, as well as through strain-absorbing layer 522, thin group IV layer 506, and insulator layer 504. Second through-semiconductor via 542 also includes conductive fill 543, which forms a cathode electrode electrically coupling cathode 514 through N+ layer 513b to drain electrode 534. In some implementations, it may be desirable to utilize a different conductive material to form conductive fill 543 than that used to implement drain electrode 534.

It is noted that in certain implementations, it may be desirable that first and second through-semiconductor vias 541 and 542 include a sidewall dielectric (not shown in FIG. 5). Such a sidewall dielectric may be a sidewall oxide, for example, such as a deposited oxide. In some implementations, it may be advantageous or desirable to include the added electrical isolation provided by a sidewall dielectric between conductive fill 543 and the diode, and/or thin group IV layer, transition body, and transistor layers penetrated by one or both of first and second through-semiconductor vias 541 and 542. It is noted that such a sidewall dielectric would not be disposed at the respective bottom surfaces of first and second through-semiconductor vias 541 and 542. As a result, conductive fill 543 of first through-semiconductor via 541 would remain ohmically coupled to anode 512 through P+ layer 511b, and conductive fill 543 of second through-semiconductor via 542 would remain ohmically coupled to cathode 514 through N+ layer 513b.

Referring now to FIG. 6, FIG. 6 presents a cross-sectional view of an exemplary implementation of a composite semiconductor device including a transistor formed over a SOI substrate including an integrated diode coupled to the transistor using both an external electrical connector and a through-semiconductor via. It is noted that although FIG. 6 expressly teaches the use of through-semiconductor vias and external electrical connections in conjunction with the composite semiconductor device structure shown by FIG. 3, one of ordinary skill in the art will recognize that the solution disclosed by FIG. 6 can be adapted for use with the composite semiconductor device structures shown by FIGS. 2 and 4.

Composite semiconductor device 600 includes SOI substrate 601 having diode 610 including anode 612 and cathode 614 formed therein, insulator layer 604 disposed over diode 610, and thin group IV layer 606 situated over insulator layer 604. Composite semiconductor device 600 also includes transition body 620 formed over SOI substrate 601, and transistor 630 formed over transition body 620. Transistor 630 includes channel layer 631 and barrier layer 633 producing 2DEG 635 near their heterojunction interface, as well as source electrode 632, drain electrode 634, and gate electrode 636 disposed over gate dielectric 638. Transition body 620 includes strain-absorbing layer 622, nucleation layer 624, transition layers 626, and buffer layer 628.

Diode 610 includes P type diode layer 611a providing anode 612, N type diode layer 613a providing cathode 614 and disposed over P type diode layer 611a, and P+ layer 611b and N+ layer 613b providing contact and current spreading layers for anode 612 and cathode 614, respectively. Also shown in FIG. 6 are through-semiconductor via 642 including conductive fill 643, backside contact 672, anode electrode 642, and external electrical connector 652.

Diode 610 corresponds to diode 310, in FIG. 3. In addition, transition body 620 and transistor 630, in FIG. 6, correspond respectively to transition body 320 and transistor 330, in FIG. 3. As shown in FIG. 6, through-semiconductor via 642 extends through transition body 620 to connect drain electrode 634 of transistor 630 to cathode 614 of diode 610 by terminating in N+ layer 613b. As further shown in FIG. 6, external electrical connector 652 connects source electrode 632 of transistor 630 to anode 612 of diode 610 through anode electrode 642, backside contact 672 and P+ layer 611b. In other words, diode 610 is coupled across transistor 630 in an antiparallel configuration using an internal electrical connector, implemented as through-semiconductor via 642 including conductive fill 643, and external electrical connector 652.

In one implementation, external electrical connector 652 may include one or more bond wires, such as gold (Au) or copper (Cu) bond wires, for example. However, in other implementations, external electrical connector 652 may take the form of conductive ribbons, conductive metal clips, or other connectors formed of conductive materials such as Al, Au, Cu, and/or other metals or composite materials.

Backside contact 672 may be formed of metal or doped polysilicon, for example, or any other suitable conductive material. In certain other implementations, backside contact 672 may be formed on the backside of a double sided finished group IV substrate as disclosed in U.S. Pat. No. 7,915,645 issued on Mar. 29, 2011, and titled "Monolithic Vertically Integrated Composite Group III-V and Group IV Semiconductor Device and Method for Fabricating Same." In certain other implementations, backside contact 672 may include several conductive elements such as conductive bond pads, solder, conductive paste or epoxy, and/or a conductive substrate or leadframe of a package, for example.

According to the implementation shown in FIG. 6, through-semiconductor via 642 also includes conductive fill 643, which forms a cathode electrode electrically coupling cathode 614 to drain electrode 634 through N+ layer 613b. It is noted that in certain implementations, as discussed above in reference to FIG. 5, it may be desirable that through-semiconductor via 642 include a sidewall dielectric. It is further noted that the implementation shown in FIG. 6 may be reversed such that the through-substrate via couples source contact 632 to anode 612 of diode 610, and external electrical connector 652 is used to couple drain contact 634 to cathode 614 of diode 610.

Thus, by coupling a diode having a breakdown voltage less than a breakdown voltage of a transistor, across the transistor in an antiparallel configuration, the present application discloses a composite semiconductor device designed to provide voltage protection for the transistor. In addition, by utilizing an HV transistor and antiparallel HV diode, the present application discloses a rugged, durable HV composite semiconductor device suitable for use in extreme operating environments. Moreover, by implementing external electrical connectors and/or through-semiconductor vias to couple the diode across the transistor in the antiparallel configuration, the present application discloses a monolithically integrated composite semiconductor device having voltage protection.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A composite semiconductor device comprising:
    a semiconductor on insulator (SOI) substrate including a diode having an anode and a cathode;
    said diode including an anode layer having a first conductivity type, and a highly doped layer having said first conductivity type adjoining said anode layer;
    said diode further including a cathode layer having a second conductivity type opposite said first conductivity type, and a highly doped layer having said second conductivity type adjoining said cathode layer;
    a transition body formed over said diode;
    a transistor formed over said transition body, said transistor including a source and a drain;
    said source being connected to said diode by a first electrical connector;
    said drain being connected to said diode by a second electrical connector;
    wherein one of said highly doped layer having said first conductivity type or said highly doped layer having said second conductivity type is situated over and adjoins said anode layer and said cathode layer such that neither said anode layer nor said cathode layer is adjoined by any other material layer situated over said anode layer and said cathode layer.

2. The composite semiconductor device of claim 1, wherein said transition body is compositionally graded.

3. The composite semiconductor device of claim 1, wherein said transistor comprises a group III-V high electron mobility transistor (HEMT).

4. The composite semiconductor device of claim 1, wherein said diode is a PN junction diode.

5. The composite semiconductor device of claim 4, wherein said PN junction diode is lifetime engineered to reduce a recovery time for a stored charge of said PN junction diode.

6. The composite semiconductor device of claim 1, wherein said diode is a PIN diode.

7. The composite semiconductor device of claim 1, wherein said diode comprises a group IV diode.

8. The composite semiconductor device of claim 1, wherein said first electrical connector connects an anode of said diode to a source of said transistor and said second electrical connector connects a cathode of said diode to a drain of said transistor.

9. The composite semiconductor device of claim 1, wherein a breakdown voltage of said transistor is greater than a breakdown voltage of said diode.

10. The composite semiconductor device of claim 1, wherein said first and second electrical connectors are implemented using respective first and second through-semiconductor vias.

11. The composite semiconductor device of claim 10, wherein at least one of said first and second through-semiconductor vias includes a sidewall dielectric.

12. The composite semiconductor device of claim 1, wherein said SOI substrate has an electrode for at least one of said cathode and said anode terminated on a backside contact of said composite semiconductor device.

13. The composite semiconductor device of claim 1, wherein said diode is connected across said transistor on one side by a through-semiconductor via, and on another side by an external electrical connector.

14. The composite semiconductor device of claim 1, wherein said diode is formed over an insulator layer of said SOI substrate.

15. The composite semiconductor device of claim 1, wherein said diode is formed under an insulator layer of said SOI substrate.

16. A composite semiconductor device comprising:
    a semiconductor on insulator (SOI) substrate including a group IV diode having an anode and a cathode;
    said group IV diode including an anode layer having a first conductivity type, and a highly doped layer having said first conductivity type adjoining said anode layer;
    said group IV diode further including a cathode layer having a second conductivity type opposite said first conductivity type, and a highly doped layer having said second conductivity type adjoining said cathode layer;
    a group III-V transition body formed over said group IV diode said group III-V transition body including a plurality of group III-V material layers;
    a group III-V transistor formed over said group III-V transition body, said group III-V transistor including a source and a drain;
    said source being connected to said group IV diode by a first electrical connector;
    said drain being connected to said group IV diode by a second electrical connector;
    wherein one of said highly doped layer having said first conductivity type or said highly doped layer having said second conductivity type is situated over and adjoins said anode layer and said cathode layer such that neither said anode layer nor said cathode layer is adjoined by any other material layer situated over said anode layer and said cathode layer.

17. The composite semiconductor device of claim 16, wherein said group III-V transition body is compositionally graded.

18. The composite semiconductor device of claim 16, wherein said group III-V transistor comprises a III-Nitride high electron mobility transistor (HEMT).

19. The composite semiconductor device of claim 16, wherein said group IV diode is a PN junction diode.

20. The composite semiconductor device of claim 19, wherein said PN junction diode is lifetime engineered to reduce a recovery time for a stored charge of said PN junction diode.

21. The composite semiconductor device of claim 16, wherein said group IV diode is a PIN diode.

22. The composite semiconductor device of claim 16, wherein said first electrical connector connects an anode of said group IV diode to a source of said group III-V transistor and said second electrical connector connects a cathode of said group IV diode to a drain of said group III-V transistor.

23. The composite semiconductor device of claim 16, wherein a breakdown voltage of said group III-V transistor is greater than a breakdown voltage of said group IV diode.

24. The composite semiconductor device of claim 16, wherein said first and second electrical connectors are implemented using respective first and second through-semiconductor vias.

25. The composite semiconductor device of claim 24, wherein at least one of said first and second through-semiconductor via includes a sidewall dielectric.

26. The composite semiconductor device of claim 16, wherein said SOI substrate has an electrode for at least one of said cathode and said anode terminated on a backside contact of said composite semiconductor device.

27. The composite semiconductor device of claim 16, wherein said group IV diode is connected across the group III-V transistor on one side by a through-semiconductor via, and on another side by an external electrical connector.

28. The composite semiconductor device of claim 16, wherein said group IV diode is formed over an insulator layer of said SOI substrate.

29. The composite semiconductor device of claim 16, wherein said group IV diode is formed under an insulator layer of said SOI substrate.

\* \* \* \* \*